(12) United States Patent
Khojasteh et al.

(10) Patent No.: US 7,608,390 B2
(45) Date of Patent: Oct. 27, 2009

(54) TOP ANTIREFLECTIVE COATING COMPOSITION CONTAINING HYDROPHOBIC AND ACIDIC GROUPS

(75) Inventors: Mahmoud Khojasteh, Poughkeepsie, NY (US); Wu-Song Huang, Poughkeepsie, NY (US); Margaret C. Lawson, LaGrangeville, NY (US); Kaushal S. Patel, Wappingers Falls, NY (US); Irene Popova, Beacon, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 11/462,527

(22) Filed: Aug. 4, 2006

(65) Prior Publication Data

US 2008/0032228 A1    Feb. 7, 2008

(51) Int. Cl.
*G03F 7/40*    (2006.01)
*G03F 7/11*    (2006.01)

(52) U.S. Cl. .................. 430/325; 438/952; 430/311; 430/323; 430/313; 430/317; 430/318; 430/273.1

(58) Field of Classification Search .................. 438/952
See application file for complete search history.

(56) References Cited

U.S. PATENT DOCUMENTS

| | | | |
|---|---|---|---|
| 6,274,295 | B1 | 8/2001 | Dammel et al. |
| 6,426,298 | B1 * | 7/2002 | Chen et al. .................. 438/699 |
| 6,534,239 | B2 | 3/2003 | Varanasi et al. |
| 6,635,401 | B2 | 10/2003 | Li et al. |
| 6,696,760 | B2 * | 2/2004 | Powers ........................ 257/758 |
| 6,949,325 | B2 | 9/2005 | Li et al. |
| 2003/0027076 | A1 * | 2/2003 | Szmanda .................. 430/270.1 |
| 2005/0233254 | A1 * | 10/2005 | Hatakeyama et al. ....... 430/311 |
| 2007/0087285 | A1 * | 4/2007 | Huang et al. ............. 430/270.1 |

* cited by examiner

*Primary Examiner*—Cynthia Hamilton
(74) *Attorney, Agent, or Firm*—Scully, Scott, Murphy & Presser, P.C.; Steven Capella

(57) ABSTRACT

The present invention discloses a composition suitable for use as a top antireflective coating and barrier layer for immersion lithography. The inventive composition is soluble in aqueous base solutions and insoluble in water. The inventive composition comprises a polymer having at least one hydrophobic moiety, at least one acidic moiety with a pKa of 1 or less, and at least one aqueous base soluble moiety. The present invention also discloses a method of forming a patterned layer on a substrate by using the inventive composition in lithography.

1 Claim, No Drawings

TOP ANTIREFLECTIVE COATING COMPOSITION CONTAINING HYDROPHOBIC AND ACIDIC GROUPS

FIELD OF THE INVENTION

The present invention relates to a top antireflective coating ("TARC") material and barrier layer and the use thereof in lithographic processes. Particularly, the present invention is directed to a hydrophobic TARC material that is insoluble in water, yet soluble in an aqueous base developer thereby removable in the development stage. The inventive TARC material may be especially useful for immersion lithography in which a liquid such as water is used as the exposure medium between the lens fixture of an exposure tool and the photoresist-coated wafer.

BACKGROUND OF THE INVENTION

In the microelectronics industry as well as in other industries involving construction of microscopic structures (e.g., micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieve reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a base solution, typically an aqueous alkaline developer, to selectively remove portions of the resist layer to obtain the desired pattern. The pattern is subsequently transferred to an underlying material by etching the material in openings of the patterned resist layer. After the transfer is complete, the remaining resist layer is removed.

For many lithographic imaging processes, the resolution of the resist image may be limited by anomalous effects associated with refractive index mismatch and undesired reflections of imaging radiation. To address these problems, antireflective coatings are often employed between the resist layer and the substrate (bottom antireflective coating, also known as BARC) and/or between the resist and the atmosphere in the physical path along which the imaging radiation is transmitted (top antireflective coating, also known as TARC).

For immersion lithography, there are some concerns that certain components in the photoresist may leach out to the immersion medium and change the performance of the photoresist, or that the immersion medium may diffuse into the photoresist and affect the acid generation thereby adversely interfering with the chemical amplification mechanism. To alleviate these problems, a topcoat material can be used between the immersion medium and the resist-coated wafer.

In the case of dry lithographic processes, such as dry 193 nm lithography (not involving an immersion fluid in the radiation exposure step), the atmosphere would typically be air. In the case of immersion lithography, the atmosphere would typically be water. Water has a refractive index (n) value of around 1.437 at 193 nm. Thus, if future immersion lithography requires fluids having refractive index (n) values above 1.6, the atmosphere would likely be hydrocarbons.

The performance of an antireflective coating composition is largely dependent on its optical characteristics at the imaging radiation wavelength of interest. A general discussion regarding typically desired optical characteristics of TARCs can be found in U.S. Pat. No. 6,274,295. Among the optical parameters of interest are the refractive index, the reflectance and the optical density of the TARC.

The antireflective coating composition must also have the desired physical and chemical performance characteristics in the context of its use in contact directly with, or in close proximity to, the resist layer and in the context of the overall lithographic process (irradiation, development, pattern transfer, etc.). Thus, the TARC should not excessively interfere with the overall lithographic process. It is highly desirable that a TARC is removed during the image development step which typically involves dissolution of a portion of the resist in an aqueous alkaline developer solution.

The existing commercial TARC compositions do not possess the combination of optical properties and physical and chemical performance characteristics needed for immersion lithography. For example, some prior art TARC compositions have a desired refractive index below 1.6, but are not soluble in aqueous alkaline developers, thereby causing undesired complication and expense of a separate TARC removal step. Other prior art TARC compositions have a desired refractive index, but adversely interact with the resist thus leading to excessive film loss and loss of contrast in the resulting resist image or formation of undesired T-top structures. By "T-top structure", it is meant that a low solubility thin skin layer forms on top of photoresists to create a "T" shape profile on the resist images. Another prior art TARC compositions containing solvent which is too volatile and flammable, thus is considered unsafe for manufacture.

It has been found that the surface tension of the immersion TARC materials has strong relationship with the prevention of certain defects caused by water droplets left over during high speed exposure scan. A hydrophobic TARC would alleviate this problem by having a high contact angle of water on its surface to prevent meniscus water droplet formation. The hydrophobic surface would also prevent leaching of chemicals to the water. Therefore, there is a need to develop new immersion TARC materials having hydrophobic characteristics.

Thus, there remains a need for TARC compositions suitable for use in immersion lithographic processes that are soluble in aqueous base developers and insoluble in water. It is also desirable that these TARC compositions can be readily prepared from commercially available starting materials, on which water has high contact angle.

SUMMARY OF THE INVENTION

Accordingly, the present invention provides a top antireflective coating and barrier layer material for applying on top of a photoresist material. The inventive top antireflective coating and barrier layer material comprises a polymer having at least one hydrophobic moiety, at least one acidic moiety with a pKa of 1 or less, and at least one aqueous base soluble moiety.

It is preferred that the at least one hydrophobic moiety comprises a hydrocarbon, a fluorocarbon, or silicon. It is more preferred that the at least one hydrophobic moiety comprises a monomer unit having one of the following monomer structures:

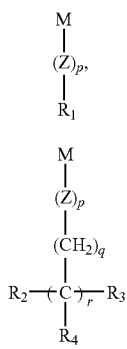

(I)

$$\begin{array}{c} M \\ | \\ (Z)_{p'} \\ | \\ R_1 \end{array}$$

(II)

$$\begin{array}{c} M \\ | \\ (Z)_p \\ | \\ (CH_2)_q \\ | \\ R_2\!-\!(C)_r\!-\!R_3 \\ | \\ R_4 \end{array}$$

wherein M is a polymerizable backbone moiety; Z is a linking moiety selected from the group consisting of —C(O)O—, —C(O)—, —OC(O)—, and —O—C(O)—C(O)—O—; $R_1$ is an alkyl group having 2 to 20 carbon atoms; $R_2$ and $R_3$ are the same or different, and are independently selected from the group consisting of a hydrogen atom, a halogen atom, a linear alkyl having 1 to 6 carbon atoms, a branched alkyl having 1 to 6 carbon atoms, a cycloalkyl having 3 to 10 carbon atoms, a halogenated linear alkyl having 1 to 6 carbon atoms, a halogenated branched alkyl having 1 to 6 carbon atoms, a halogenated cycloalkyl having 3 to 10 carbon atoms, an aryl, and a halogenated aryl; $R_4$ is selected from the group consisting of a fluorine atom, a fluorinated linear alkyl having 1 to 20 carbon atoms, a fluorinated branched alkyl having 1 to 20 carbon atoms, and a fluorocycloalkyl having 3 to 20 carbon atoms; p is an integer of 0 or 1; q is an integer of 0, 1, or 2; and r is an integer of 0 or 1.

It is also preferred that the at least one acidic moiety with a pKa of 1 or less comprises a monomer unit having the following monomer structure:

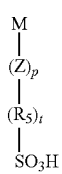

(XVIII)

$$\begin{array}{c} M \\ | \\ (Z)_p \\ | \\ (R_5)_t \\ | \\ SO_3H \end{array}$$

wherein M is a polymerizable backbone moiety; Z is a linking moiety selected from the group consisting of —C(O)O—, —C(O)NH—, —OC(O)—, and —NHC(O)—; $R_5$ is an alkylene group having 1 to 20 carbon atoms; p is an integer of 0 or 1; and t is an integer of 0 or 1.

It is also preferred that the at least one aqueous base soluble moiety comprises a monomer unit having the following monomer structure:

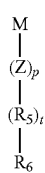

(XXIII)

$$\begin{array}{c} M \\ | \\ (Z)_p \\ | \\ (R_5)_t \\ | \\ R_6 \end{array}$$

wherein M is a polymerizable backbone moiety; Z is a linking moiety selected from the group consisting of —C(O)O—, —C(O)—, —OC(O)—, and —O—C(O)—C(O)—O—; $R_5$ is an alkylene group having 1 to 20 carbon atoms; $R_6$ is hydroxyl, amino, imino, carboxylic acid, sulfonamide, dicarboxyimide, N-hydroxydicarboxyimide, perfluorinated alcohol having 1 to 6 carbon atoms, or perfluorinated sulfonamide having 1 to 6 carbon atoms; p is an integer of 0 or 1; and t is an integer of 0 or 1.

The present invention also provides a method of forming a patterned layer on a substrate. The method comprises providing a substrate having a material layer on a surface thereof, depositing a photoresist composition on the substrate to form a photoresist layer on the material; applying the inventive top antireflective coating and barrier layer material on the photoresist layer to form a top antireflective and barrier layer; pattern-wise exposing the photoresist layer and the top antireflective and barrier layer to an imaging radiation; removing the top antireflective and barrier layer and the exposed portions of the photoresist layer to form a patterned photoresist layer on the material layer; and transferring the pattern in the photoresist layer to the material layer.

DETAILED DESCRIPTION OF THE INVENTION

As stated above, the present invention is directed to a top antireflective coating and barrier layer material for applying on top of a photoresist material. The inventive top antireflective coating and barrier layer material comprises a polymer having at least one hydrophobic moiety, at least one acidic moiety with a pKa of 1 or less, and at least one aqueous base soluble moiety. The photoresist material may be a non-silicon-containing resist or a silicon-containing resist. It should be noted that the inventive antireflective coating can be referred to as a TARC.

It is preferred that the at least one hydrophobic moiety comprises a hydrocarbon, a fluorocarbon, or silicon. The term "hydrocarbon" as used herein denotes an organic moiety containing only carbon and hydrogen. The term "fluorocarbon" as used herein denotes an organic moiety containing only carbon and fluorine. It is more preferred that the at least one hydrophobic moiety comprises a monomer unit having one of the following monomer structures:

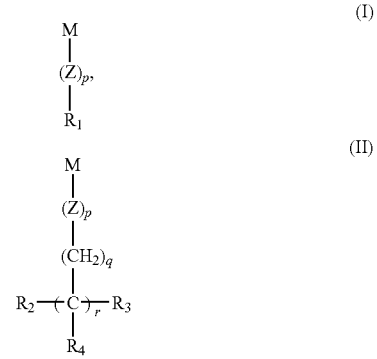

(I)

$$\begin{array}{c} M \\ | \\ (Z)_{p'} \\ | \\ R_1 \end{array}$$

(II)

$$\begin{array}{c} M \\ | \\ (Z)_p \\ | \\ (CH_2)_q \\ | \\ R_2\!-\!(C)_r\!-\!R_3 \\ | \\ R_4 \end{array}$$

wherein M is a polymerizable backbone moiety; Z is a linking moiety selected from the group consisting of —C(O)O—, —C(O)—, —OC(O)—, and —O—C(O)—C(O)—O—; $R_1$ is an alkyl group having 2 to 20 carbon atoms; $R_2$ and $R_3$ are the same or different, and are independently selected from the group consisting of a hydrogen atom, a halogen atom, a linear alkyl having 1 to 6 carbon atoms, a branched alkyl having 1 to 6 carbon atoms, a cycloalkyl having 3 to 10 carbon atoms, a halogenated linear alkyl having 1 to 6 carbon atoms, a halogenated branched alkyl having 1 to 6 carbon atoms, a halogenated cycloalkyl having 3 to 10 carbon atoms, an aryl, and a halogenated aryl; $R_4$ is selected from the group consisting of a fluorine atom, a fluorinated linear alkyl having 1 to 20 carbon atoms, a fluorinated branched alkyl having 1 to 20 carbon atoms, and a fluorocycloalkyl having 3 to 20 carbon atoms; p is an integer of 0 or 1; q is an integer of 0, 1, or 2; and r is an integer of 0 or 1. By "halogenated alkyl", it is meant an alkyl group wherein at least a portion of hydrogen atoms are substituted by halogen atoms. Halogen atoms suitable for the present invention include, but are not limited to: fluorine atom, chlorine atom, and bromine atom. By "fluorinated alkyl", it is meant an alkyl group wherein at least a portion of hydrogen atoms are substituted by fluorine atoms.

It is also preferred that the at least one hydrophobic moiety comprises a monomer unit having a lactone group. The term "a lactone group" as used herein denotes a cyclic ester, which is the condensation product of an alcohol group and a carboxylic acid group in the same molecule. The lactone group may be monocyclic or polycyclic. The rings in the polycyclic lactone group may be fused or non-fused. Preferably, the lactone group is a beta-lactone, a gamma-lactone, or a delta-lactone. It is understood by one skilled in the art that the prefixes, such as beta, gamma, and delta, indicate the ring size of a lactone. That is, a beta-lactone, a gamma-lactone, and a delta-lactone denote a 4-membered, a 5-membered, and a 6-membered lactone ring, respectively. Examples of the lactone group suitable for the present invention include, but are not limited to: beta-propiolactone, gamma-butyrolactone, 2,6-norbornane-gamma-carbolactone, and 2,6-norbornane-delta-carbolactone. The lactone group of the present invention may be further substituted by other chemical groups, such as an alkyl group having 1 to 6 carbon atoms, halogen, hydroxyl, cyano, and an alkoxyl having 1 to 6 carbon atoms.

The term "polymerizable backbone moiety" as used herein denotes an organic radical that can readily undergo polymerization. Preferably, the polymerizable backbone moiety, i.e., M, in formula (I) is an organic radical containing one or more vinyl groups. As used herein, the term "C(O)" denotes a carbonyl group. The linkage moiety expressed as "-linkage-" denotes a linkage in the manner as follows: M-linkage-$(R^2)_q$. For example, "—C(O)O—" denotes a linkage as follows: M—C(O)O—$(R^2)_q$. Preferably, the linkage moiety of the present invention, i.e., $R^1$, is —C(O)O—.

It is more preferred that the at least one hydrophobic moiety comprises a monomer unit with monomer selected from the group consisting of

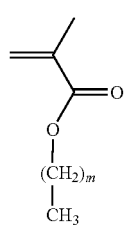

(III)

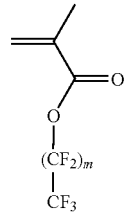

(IV)

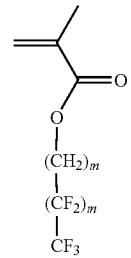

(V)

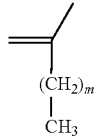

(VI)

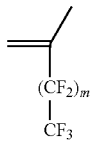

(VII)

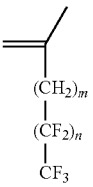

(VIII)

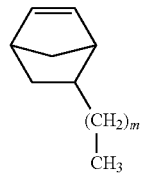

(IX)

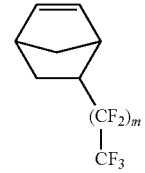

(X)

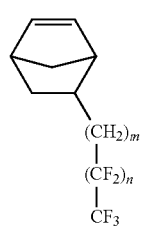

(XI)

(XII) 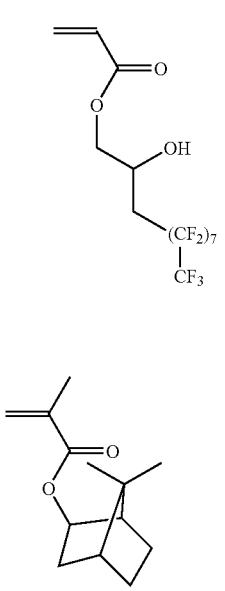

(XIII) 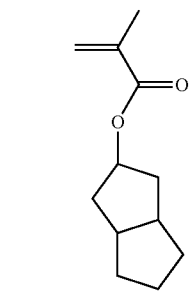
and (XIV) 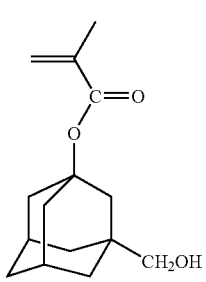

(XV) 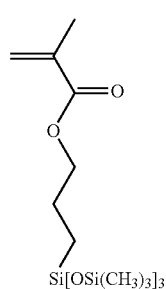

(XVI) 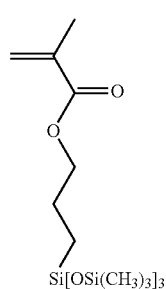

(XVII) 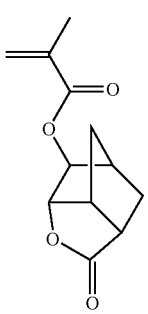

wherein m is an integer of 1 to 19, and n is an integer of 1 to 18.

It is preferred that the at least one acidic moiety with a pKa of 1 or less comprises a sulfur-containing acidic moiety. It is more preferred that the at least one acidic moiety with a pKa of 1 or less comprises a monomer unit having the following monomer structure:

$$\begin{array}{c} M \\ | \\ (Z)_p \\ | \\ (R_5)_t \\ | \\ SO_3H \end{array} \quad \text{(XVIII)}$$

wherein M is a polymerizable backbone moiety; Z is a linking moiety selected from the group consisting of —C(O)O—, —C(O)NH—, —OC(O)—, and —NHC(O)—; $R_5$ is an alkylene group having 1 to 20 carbon atoms; p is an integer of 0 or 1; and t is an integer of 0 or 1. Preferably, Z is —NHC(O)—. M is defined the same as described above.

It is most preferred that the at least one acidic moiety with a pKa of 1 or less comprises a monomer unit with monomer selected from the group consisting of (XIX) 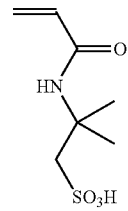

(XX) 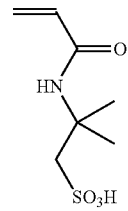

(XXI) 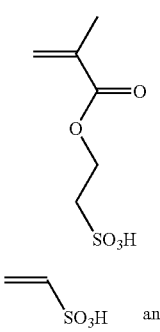
and

-continued

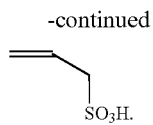
(XXII)

It is preferred that the at least one aqueous base soluble moiety comprises a monomer unit having the following monomer structure:

(XXIII)

wherein M is a polymerizable backbone moiety; Z is a linking moiety selected from the group consisting of —C(O)O—, —C(O)—, —OC(O)—, and —O—C(O)—C(O)—O—; $R_5$ is an alkylene group having 1 to 20 carbon atoms; $R_6$ is hydroxyl, amino, imino, carboxylic acid, sulfonamide, dicarboxyimide, N-hydroxydicarboxyimide, perfluorinated alcohol having 1 to 6 carbon atoms, or perfluorinated sulfonamide having 1 to 6 carbon atoms; p is an integer of 0 or 1; and t is an integer of 0 or 1. M is defined the same as the above. Preferably, Z is —C(O)O—. By "perfluorinated alcohol" or "perfluorinated sulfonamide", it is meant all hydrogen atoms on the carbonic core of the alcohol or sulfonamide are substituted by fluorine atoms. M is defined the same as described above.

It is more preferred that the at least one aqueous base soluble moiety comprises a monomer unit with monomer selected from the group consisting of

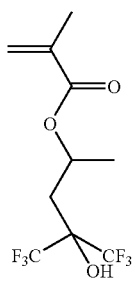
(XXIV)

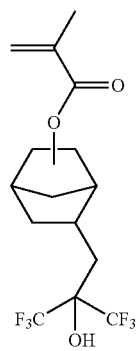
(XXV)

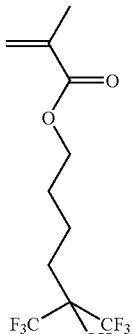
(XXVI)

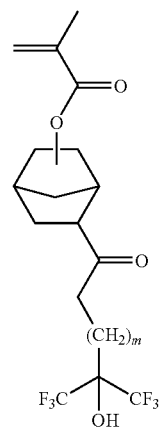
(XXVII)

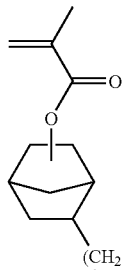
(XXVIII)

and

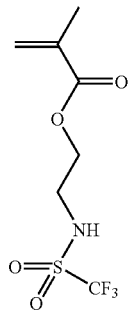
(XXIX)

wherein m is an integer of 1 to 19.

The optical characteristics, solubility, hydrophobicity, and other physiochemical properties of the inventive polymer may be adjusted by either varying the ratio among the at least one hydrophobic moiety, the at least one acidic moiety with a pKa of 1 or less, and the at least one aqueous base soluble moiety, or introducing functional groups into the at least one hydrophobic moiety, the at least one acidic moiety with a pKa of 1 or less, and the at least one aqueous base soluble moiety.

The at least one hydrophobic moiety imparts hydrophobicity to the inventive polymer thereby reducing the propensity of the inventive polymer to form watermarks when contacted with water. It is preferred that the inventive polymer contains the at least one hydrophobic moiety at a particular amount and proportion so that the inventive top antireflective coating and barrier layer material has a surface tension that prevents immersion-specific defects. In one embodiment of the present invention, the inventive top antireflective coating and barrier layer material has a static contact angle of water droplet above 70°. In a more preferred embodiment of the present invention, the inventive top antireflective coating and barrier layer material has a static contact angle of water droplet above 80°. In the most preferred embodiment of the present invention, the inventive top antireflective coating and barrier layer material has a static contact angle of water droplet above 90°. Furthermore, the at least one hydrophobic moiety increases the glass transition temperature (Tg) of the inventive polymer thereby reducing leaching of the photo acid generator (PAG) to the immersion liquid.

The at least one acidic moiety with a pKa of 1 or less promotes base solubility, controls thinning in the underlying photoresist, and suppresses leaching of the PAG to the immersion liquid. It is preferred that the at least one acidic moiety with a pKa of 1 or less contains a sulfonic acid unit. It is more preferred that the at least one acidic moiety with a pKa of 1 or less contains an acrylamide sulfonic acid, such as, for example, the monomer unit of formula (XIX). The at least one acidic moiety with a pKa of 1 or less containing an acrylamide sulfonic acid can be synthesized from low-cost commercially available material using well known chemical processes, therefore utilization of monomer units containing acrylamide sulfonic acids can reduce the complexity of synthesis of the inventive polymer thus enabling preparation of the same in large scale.

The at least one aqueous base soluble moiety increases the solubility of the inventive polymer in an aqueous base developer. It is preferred that the at least one aqueous base soluble moiety contains a perfluorinated alcohol. The at least one aqueous base soluble moiety containing a perfluorinated alcohol not only introduces optimal optical properties into the inventive polymer, but also imparts desirable linear solubility of the inventive polymer in an aqueous base developer. Moreover, the at least one aqueous base soluble moiety containing a perfluorinated alcohol also renders the inventive polymer insoluble in water and soluble in solvents that are immiscible with the photoresist material.

The inventive top antireflective coating and barrier layer material may further comprise at least one solvent which is immiscible with the underlying photoresist material. Preferably, the at least one solvent is a polar organic solvent, such as an alcohol or a diol. In one embodiment of the present invention, the at least one solvent is selected from the group consisting of 1-butanol, methanol, ethanol, 1-propanol, ethylene glycol, 1,2-butanediol, 1,3-butanediol, 1,4-butanediol, 1,2-propanediol, 1-methyl-2-butanol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, and 1,3-propanediol.

If desired, additional co-monomers may be introduced to modify the dissolution, casting, and other physiochemical properties of the inventive polymer. It is preferred that the inventive polymer is so prepared that the top antireflective coating and barrier layer material of the present invention has a real part of refractive index (n) at 193 nm in a range from about 1.3 to about 1.8, with a range from about 1.3 to about 1.6 more preferred. It also preferred that the inventive composition has an extinction coefficient (k) at 193 nm in a range from about 0 to about 0.25. The polymers of the invention preferably have a weight average molecular weight of at least about 1,000, more preferably a weight average molecular weight from about 1,500 to about 50,000.

In another aspect of the present invention, the inventive TARC material may be used in a method of forming a patterned material layer on a substrate. The material layer may be, for example, a ceramic, dielectric, metal or semiconductor layer, such as those used in the manufacture of high performance integrated circuit devices and associated chip carrier packages. The inventive composition is especially useful for lithographic processes used in the manufacture of integrated circuits on semiconductor substrates. The inventive composition may be used in lithographic processes to create patterned material layer structures such as metal wiring lines, holes for contacts or vias, insulation sections (e.g., damascene trenches or shallow trench isolation), trenches for capacitor structures, ion implanted Si structures for transistors, etc. as might be used in integrated circuit devices.

In the inventive method, a photoresist composition is first deposited on the substrate by known means, to form a photoresist layer on the material. The substrate with the photoresist layer may then be baked (post-apply bake, herein after "PAB") to remove any solvent from the photoresist composition and improve the coherence of the photoresist layer. A typical PAB baking temperature is about 80° to about 150° C. A typical photoresist thickness is about 100 to about 500 nm. Any suitable resist composition may be used, such as the resist composition disclosed in U.S. Pat. Nos. 6,534,239 and 6,635,401 B2, and U.S. patent application Ser. No. 10/663,553, filed Sep. 16, 2003, the disclosures of which are incorporated herein by reference.

Next, the inventive TARC material is applied on the photoresist layer to form a top antireflective and barrier layer. That is, the top antireflective and barrier material is applied on the photoresist layer thereby forming a coated substrate. The top antireflective and barrier layer substantially reduces the substrate reflectivity with respect to 193 nm radiation. If desired, a bottom antireflective coating may be applied to the substrate prior to formation of the resist layer. The inventive composition is preferably applied directly over the photoresist layer by spin-coating. Any solvent in the inventive composition is then removed via a softbaking process. A typical softbaking temperature is about 90° C. A typical softbaking time is about 90 seconds. The thickness of the top antireflective and barrier layer is typically in the range from about 20 to about 60 nm.

The photoresist layer and the top antireflective and barrier layer are then exposed to an appropriate radiation source through a patterned mask. In one exemplary embodiment, the imaging radiation is 193 nm radiation. The coated substrate also may be exposed to such imaging radiation using immersion lithography, wherein an imaging medium is applied to the coated substrate prior to exposure. In a preferred embodiment, the imaging medium is water. For 193 nm UV radiation, the total exposure energy is preferably about 100 millijoules/cm² or less, more preferably about 50 millijoules/cm² or less (e.g., 15-30 millijoules/cm²). After the desired patternwise exposure, the resist layer is typically baked to further complete the acid-catalyzed reaction and to enhance the contrast of the exposed pattern. The post-exposure bake is preferably conducted at about 60° to about 175° C., more preferably about 90° to about 160° C. The post-exposure bake is preferably conducted for about 30 seconds to about 5 minutes.

The top antireflective and barrier layer and the exposed photoresist layer are then contacted with an aqueous base developer, such as 0.263 N tetramethyl ammonium hydroxide, thereby removing the top antireflective and barrier layer and the exposed portions of the photoresist layer from the coated substrate. As is known to those skilled in the art, contact with a developer forms a patterned photoresist layer on the material layer.

The pattern in the photoresist layer may then be transferred to the material layer on the underlying substrate. Typically, the transfer is achieved by reactive ion etching or some other etching technique. The method of the invention may be used to create patterned material layered structures such as metal wiring lines, holes for contacts or vias, insulation sections (e.g., damascene trenches or shallow trench isolation), trenches for capacitor structures, etc. as might be used in the design of integrated circuit devices. Alternatively, the pattern may be transferred by ion implantation to form a pattern of ion implanted material.

The processes to make these (ceramic, dielectric, metal or semiconductor) features generally involve providing a material layer or section of the substrate to be patterned, applying a layer of photoresist over the material layer or section, applying a top coat layer on the layer of photoresist, pattern-wise exposing the top coat and photoresist layers to radiation, post-exposure baking the exposed resist, developing the pattern by contacting the exposed top coat and photoresist with a developer, etching the layer(s) underlying the photoresist layer at spaces in the pattern whereby a patterned material layer or substrate is formed, and removing any remaining photoresist from the substrate. In some instances, a hard mask may be used below the photoresist layer to facilitate transfer of the pattern to a further underlying material layer or section. It should be understood that the invention is not limited to any specific lithography technique or device structure.

The following non-limiting examples are provided to further illustrate the present invention. Because the examples are provided for illustrative purposes only, the invention embodied therein should not be limited thereto.

EXAMPLE 1

Synthesis of Poly(2-Acrylamido-2-methyl-1-propanesulfonic acid, 4,4,-ditrifluoromethyl-4-hydroxybutan-2-yl methacrylate)-Polymer A 2.14 g (0.0130 mol) of 2,2'-azobisisobutyronitrile (AIBN) was added to a solution of 0.085 g (0.0004 mol) of 2-Acrylamido-2-methyl-1-propanesulfonic acid, 13.40 g (0.0538 mol) of 4,4,-ditrifluoromethyl-4-hydroxybutan-2-yl methacrylate, and 1.32 g (0.0065 mol) dodecanethiol in a mixture of 35 g of absolute alcohol and 10 g of THF. The solution was deoxygenated by bubbling dry $N_2$ gas through the solution for 0.5 hr and then the solution was allowed to reflux for 12 hr. The reaction mixture of the solution was cooled to room temperature and precipitated in 350 ml of distilled $H_2O$ with rigorous stirring. The resulting white solid was collected by filtration, washed with several portions of distilled $H_2O$, and dried under vacuum at 60° C. for 48 hr.

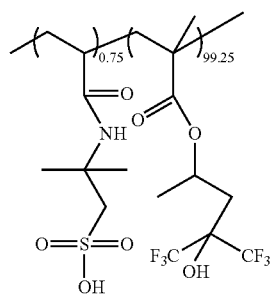

EXAMPLE 2

Synthesis of Poly[2-Acrylamido-2-methyl-1-propanesulfonic acid, 14,4,-ditrifluoromethyl-4-hydroxybutan-2-yl methacrylate, (Perfluorooctyl)propyl methacrylate]-Polymer B 2.18 g (0.0132 mol) of 2,2'-azobisisobutyronitrile (AIBN) was added to a solution of 0.1725 g (0.0008 mol) of 2-Acrylamido-2-methyl-1-propanesulfonic acid, 12.24 g (0.0491 mol) of 14,4,-ditrifluoromethyl-4-hydroxybutan-2-yl methacrylate, 2.94 g (0.0055 mol) of 2-(Perfluorooctyl)ethyl methacrylate, and 1.34 g (0.0066 mole) of dodecanethiol in a mixture of 42 g of absolute alcohol and 10 g of THF. The solution was deoxygenated by bubbling dry $N_2$ gas through the solution for 0.5 hr and then the solution was allowed to reflux for 12 hr. The reaction mixture of the solution was cooled to room temperature and precipitated in 400 ml of distilled $H_2O$ water with rigorous stirring. The resulting white solid was collected by filtration, washed with several portions of distilled $H_2O$, and dried under vacuum at 60° C. for 48 hr.

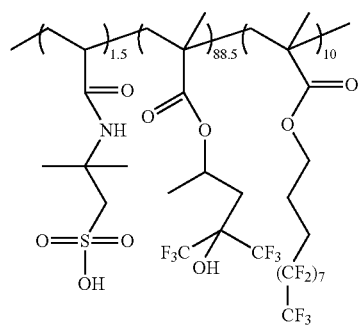

EXAMPLE 3

Synthesis of Poly(2-Acrylamido-2-methyl-1-propanesulfonic acid, 4,4,-ditrifluoromethyl-4-hydroxybutan-2-yl methacrylate, 5-methacryloyloxy-2,6-norbornanecarbo-gamma-lactone)-Polymer C 2.15 g (0.0131 mol) of 2,2'-Azobisisobutyronitrile (AIBN) was added to a solution of 0.08 g (0.0004 mol) of 2-Acrylamido-2-methyl-1-propanesulfonic acid, 9.54 g (0.0383 mol) of 4,4,-ditrifluoromethyl-4-hydroxybutan-2-yl methacrylate, 3.55 g (0.0166 mole) of 5-methacryloyloxy-2,6-norbornanecarbo-gamma-lactone and 1.32 g (0.0065 mole) of dodecanethiol in a mixture of 30 g of absolute alcohol and 10 g of THF. The solution was deoxygenated by bubbling dry N₂ gas through the solution for 0.5 hr and then the solution was allowed to reflux for 12 hr. The reaction mixture of the solution was cooled to room temperature and precipitated in 250 ml of distilled H₂O water with rigorous stirring. The resulting white solid was collected by filtration, washed with several portions of distilled H₂O, and dried under vacuum at 60° C. for 48 hr.

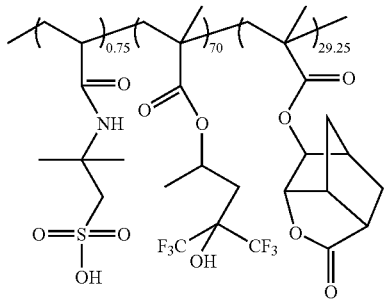

EXAMPLE 4

Synthesis of Poly(2-Acrylamido-2-methyl-1-propanesulfonic acid, 4,4,-ditrifluoromethyl-4-hydroxybutan-2-yl methacrylate, Hydroxymethyladamantylmethacrylate)-Polymer D 2.15 g (0.0131 mol) of 2,2'-Azobisisobutyronitrile (AIBN) was added to a solution of 0.08 g (0.0004 mol) of 2-Acrylamido-2-methyl-1-propanesulfonic acid, 9.54 g (0.0383 mol) of 4,4,-ditrifluoromethyl-4-hydroxybutan-2-yl methacrylate, 4.48 g (0.0160 mol) of Hydroxymethyladamantylmethacrylate and 1.32 g (0.0065 mole) of dodecanethiol in a mixture of 30 g of absolute alcohol and 10 g of THF. The solution was deoxygenated by bubbling dry N₂ gas through the solution for 0.5 hr and then the solution was allowed to reflux for 12 hr. The reaction mixture of the solution was cooled to room temperature and precipitated in 250 ml of distilled H₂O water with rigorous stirring. The resulting white solid was collected by filtration, washed with several portions of distilled H₂O, and dried under vacuum at 60° C. for 48 hr.

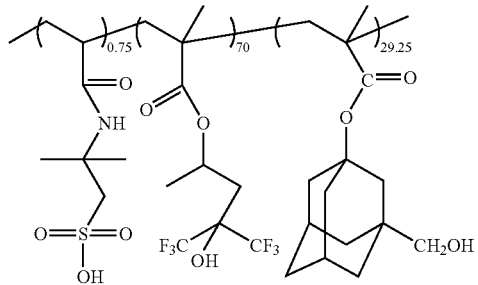

EXAMPLE 5

Synthesis of Poly(2-Acrylamido-2-methyl-1-propanesulfonic acid, 4,4,-ditrifluoromethyl-4-hydroxybutan-2-yl methacrylate, Lauryl methacrylate)-Polymer E 0.65 g (0.0039 mol) of 2,2'-Azobisisobutyronitrile (AIBN) was added to a solution of 1.03 g (0.0050 mol) of 2-Acrylamido-2-methyl-1-propanesulfonic acid, 5.37 g (0.0216 mol) of 4,4,-ditrifluoromethyl-4-hydroxybutan-2-yl methacrylate, 1.69 g (0.0066 mol) of Lauryl methacrylate and 0.40 g (0.0019 mole) of dodecanethiol in a mixture of 35 g of absolute alcohol and 5 g of THF. The solution was deoxygenated by bubbling dry N₂ gas through the solution for 0.5 hr and then the solution was allowed to reflux for 12 hr. The reaction mixture of the solution was cooled to room temperature and precipitated in 250 ml of distilled H₂O with rigorous stirring. The resulting white solid was collected by filtration, washed with several portions of distilled H₂O and dried under vacuum at 60° C. for 48 hr.

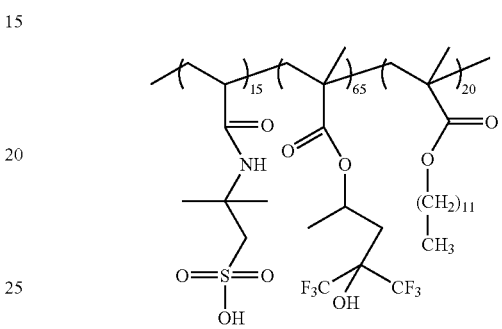

EXAMPLE 6

Synthesis of Poly(2-Acrylamido-2-methyl-1-propanesulfonic acid, 4,4,-ditrifluoromethyl-4-hydroxybutan-2-yl methacrylate, Isobornyl methacrylate)-Polymer F 2.15 g (0.0131 mol) of 2,2'-Azobisisobutyronitrile (AIBN) was added to a solution of 0.085 g (0.0004 mol) of 2-Acrylamido-2-methyl-1-propanesulfonic acid, 10.88 g (0.0437 mol) of 4,4,-ditrifluoromethyl-4-hydroxybutan-2-yl methacrylate, 2.33 g (0.0105 mol) of Isobornyl methacrylate and 1.32 g (0.0065 mole) of dodecanethiol in a mixture of 25 g of absolute alcohol and 15 g of THF. The solution was deoxygenated by bubbling dry N₂ gas trough the solution for 0.5 hr and then the solution was allowed to reflux for 12 hr. The reaction mixture of the solution was cooled to room temperature and precipitated in 350 ml of distilled H₂O with rigorous stirring. The resulting white solid was collected by filtration, washed with several portions of distilled H₂O, and dried under vacuum at 60° C. for 48 hr.

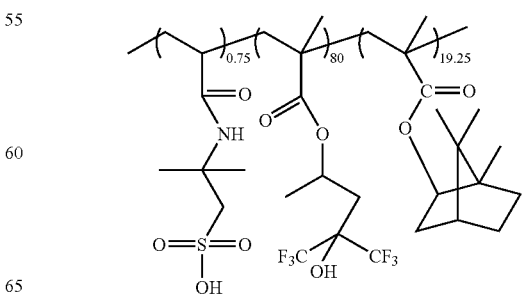

EXAMPLE 7

Synthesis of Poly(2-Acrylamido-2-methyl-1-propanesulfonic acid, 4,4,-ditrifluoromethyl-4-hydroxybutan-2-yl methacrylate, 3-bicyclo[3,3,0]octane methacrylate)-Polymer G 1.57 g (0.00975 mol) of 2,2'-Azobisisobutyronitrile (AIBN) was added to a solution of 0.085 g (0.0004 mol) of 2-Acrylamido-2-methyl-1-propanesulfonic acid, 9.29 g (0.0376 mol) of 4,4,-ditrifluoromethyl-4-hydroxybutan-2-yl methacrylate, 3.02 g (0.0156 mol) of Dicyclic methacrylate and 0.96 g (0.0047 mole) of dodecanethiol in a mixture of 20 g of absolute alcohol and 20 g of THF. The solution was deoxygenated by bubbling dry $N_2$ gas through the solution for 0.5 hr and then the solution was allowed to reflux for 12 hr. The reaction mixture of the solution was cooled to room temperature and precipitated in 350 ml of distilled $H_2O$ with rigorous stirring. The resulting white solid was collected by filtration, washed with several portions of distilled $H_2O$, and dried under vacuum at 60° C. for 48 hr.

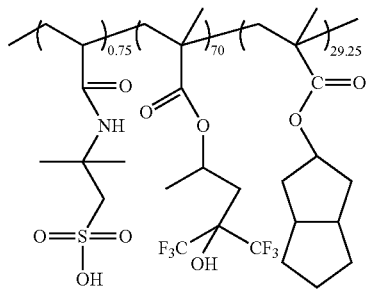

EXAMPLE 8

Synthesis of Poly[(2-Acrylamido-2-methyl-1-propanesulfonic acid, 4,4,-ditrifluoromethyl-4-hydroxybutan-2-yl methacrylate, Methacyloxypropyltris(trimethylsiloxy)silane]-Polymer H 1.38 g (0.0084 mol) of 2,2'-Azobisisobutyronitrile (AIBN) was added to a solution of 0.10 g (0.0004 mol) of 2-Acrylamido-2-methyl-1-propanesulfonic acid, 8.36 g (0.033 mol) of 4,4,-ditrifluoromethyl-4-hydroxybutan-2-yl methacrylate, 5.86 g (0.0139 mol) of Methacyloxypropyltris(trimethylsiloxy)silane and 0.85 g (0.0042 mole) of dodecanethiol in a mixture of 25 g of absolute alcohol and 20 g of THF. The solution was deoxygenated by bubbling dry $N_2$ gas through the solution for 0.5 hr and then the solution was allowed to reflux for 12 hr. The reaction mixture of the solution was cooled to room temperature and precipitated in 350 ml of distilled $H_2O$ with rigorous stirring. The resulting white solid was collected by filtration, washed with several portions of distilled $H_2O$, and dried under vacuum at 60° C. for 48 hr.

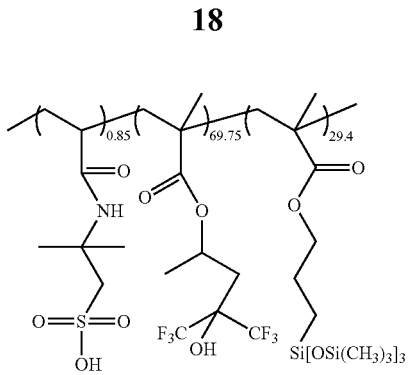

EXAMPLE 9

Synthesis of Poly(2-sulfoethylmethacrylate, 14,4,-ditrifluoromethyl-4-hydroxybutan-2-yl methacrylate, 4,4,5,5,6,6,7,7,8,8,9,9,10,10,11,11,11-heptadecafluoro-2-hydroxyundecyl acrylate)-Polymer I 0.131 g (0.0008 mol) of 2,2'-Azobisisobutyronitrile (AIBN) was added to a solution of 0.776 g (0.004 mol) of 2-sulfoethylmethacrylate, 3.82 g (0.013 mol) of 4,4,-ditrifluoromethyl-4-hydroxybutan-2-yl methacrylate, 1.65 g (0.003 mol) of 4,4,5,5,6,6,7,7,8,8,9,9,10,10,11,11,11-heptadecafluoro-2-hydroxyundecyl acrylate and 0.081 g (0.0004 mole) of dodecanethiol in 25 g of THF. The solution was deoxygenated by bubbling dry $N_2$ gas through the solution for 0.5 hr and then the solution was allowed to reflux for 12 hr. The reaction mixture of the solution was cooled to room temperature and precipitated in 350 ml of distilled $H_2O$ with rigorous stirring. The resulting white solid was collected by filtration, washed with several portions of distilled $H_2O$, and dried under vacuum at 60° C. for 48 hr.

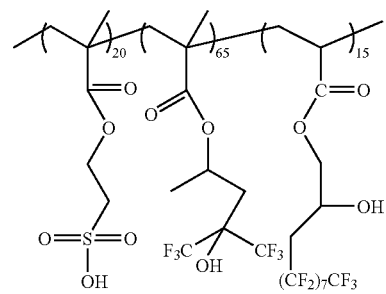

EXAMPLE 10

Contact Angles of Polymers Synthesized

Static contact angle measurements were conducted by recording measurements of contact angle for a droplet of water on the material-coated film on a silicon wafer repeatedly in order to minimize effects of evaporative load and extrapolating contact angle to t=0. Dynamic contact angle measurements represent receding contact angle of the water drop on the material-coated wafer, and were conducted by a tilting table method using a standard off-the-shelf contact angle measuring set-up.

TABLE I

Static and dynamic contact angles of immersion TARC/barrier layer polymers

| Polymer | Static CA | Dynamic CA |
|---|---|---|
| A | 88.5° | 73° |
| B | 102.8° | 74° |
| C | 92.4° | 63.3° |
| D | 91.8° | 59.5° |
| E | 95.6° | NA |
| F | 94.1° | 68.6° |
| G | 93.4° | 67.8° |
| H | 104.8° | 71.2° |
| I | 93.6° | NA |

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of forming a patterned layer on a substrate, the method comprising:

providing a substrate having a material layer on a surface thereof;

depositing a photoresist composition on the substrate to form a photoresist layer on the material;

applying a top antireflective coating and barrier layer material on the photoresist layer to form a top antireflective and barrier layer, said top antireflective coating and barrier layer material comprising a polymer selected from the group consisting of poly(2-acrylamido-2-methyl-1-propanesulfonic acid, 4,4,-ditrifluoromethyl-4-hydroxybutan-2-yl methacrylate); poly[2-acrylamido-2-methyl-1-propanesulfonic acid, 14,4,-ditrifluoromethyl-4-hydroxybutan-2-yl methacrylate acrylate, (perfluorooctyl)propyl methacrylate]; poly(2-acrylamido-2-methyl-1-propanesulfonic acid, 4,4,-ditrifluoromethyl-4-hydroxybutan-2-yl methacrylate, 5-methacryloyloxy-2,6-norbornanecarbo-gamma-lactone); poly(2-acrylamido-2-methyl-1-propanesulfonic acid, 4,4,-ditrifluoromethyl-4-hydroxybutan-2-yl methacrylate, hydroxymethyladamantylmethacrylate); poly(2-acrylamido-2-methyl-1-propanesulfonic acid, 4,4,-ditrifluoromethyl-4-hydroxybutan-2-yl methacrylate, lauryl methacrylate); poly(2-acrylamido-2-methyl-1-propanesulfonic acid, 4,4,-ditrifluoromethyl-4-hydroxybutan-2-yl methacrylate, isobornyl methacrylate); poly(2-acrylamido-2-methyl-1-propanesulfonic acid, 4,4,-ditrifluoromethyl-4-hydroxybutan-2-yl methacrylate, 3-bicyclo[3,3,0]octane methacrylate); poly[(2-acrylamido-2-methyl-1-propanesulfonic acid, 4,4,-ditrifluoromethyl-4-hydroxybutan-2-yl methacrylate, methacyloxypropyltris(trimethylsiloxy)silane]; and poly(2-sulfoethylmethacrylate, 4,4,-ditrifluoromethyl-4-hydroxybutan-2-yl methacrylate, 4,4,5,5,6,6,7,7,8,8,9,9,10,10,11,11,11-heptadecafluoro-2-hydroxyundecyl acrylate);

pattern-wise exposing the photoresist layer and the top antireflective and barrier layer to an imaging radiation;

removing the top antireflective and barrier layer and the exposed portions of the photoresist layer to form a patterned photoresist layer on the material layer; and transferring the pattern in the photoresist layer to the material layer.

* * * * *

UNITED STATES PATENT AND TRADEMARK OFFICE
CERTIFICATE OF CORRECTION

PATENT NO. : 7,608,390 B2  Page 1 of 1
APPLICATION NO. : 11/462527
DATED : October 27, 2009
INVENTOR(S) : Khojasteh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 446 days.

Signed and Sealed this

Twelfth Day of October, 2010

David J. Kappos
*Director of the United States Patent and Trademark Office*